(12) United States Patent
Dang et al.

(10) Patent No.: US 7,862,856 B1
(45) Date of Patent: Jan. 4, 2011

(54) METHOD FOR MAKING HIGH TEMPERATURE POLYMER DIELECTRIC COMPOSITIONS INCORPORATING DIAMOND-LIKE HYDROCARBON UNITS FOR CAPACTIVE ENERGY STORAGE APPLICATIONS

(75) Inventors: Thuy D. Dang, Centerville, OH (US); Narayanan Venkatasubramanian, Beavercreek, OH (US); Sandra J. Fries-Carr, Beavercreek, OH (US); Kevin J. Wiacek, Centerville, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 783 days.

(21) Appl. No.: 11/726,199

(22) Filed: Mar. 8, 2007

Related U.S. Application Data

(60) Provisional application No. 60/783,105, filed on Mar. 10, 2006.

(51) Int. Cl.
*C23C 16/12* (2006.01)
(52) U.S. Cl. .................. 427/250; 427/404
(58) Field of Classification Search ............ 427/250, 427/404; 264/129, 239
See application file for complete search history.

(56) References Cited

U.S. PATENT DOCUMENTS

| | | | | |
|---|---|---|---|---|
| 4,810,771 | A | * | 3/1989 | Teramoto et al. ............ 528/298 |
| 5,019,418 | A | * | 5/1991 | Linzey et al. ................. 427/79 |
| 5,738,926 | A | * | 4/1998 | Kinoshita .................... 428/141 |
| 5,844,770 | A | * | 12/1998 | Fries-Carr et al. ......... 361/301.5 |
| 6,018,454 | A | * | 1/2000 | Hatada et al. ............... 361/314 |
| 6,106,627 | A | * | 8/2000 | Yializis ....................... 118/724 |
| 6,445,490 | B1 | * | 9/2002 | Chopra et al. ................ 359/296 |
| 6,798,642 | B2 | * | 9/2004 | Decker et al. ................ 361/311 |
| 2005/0043449 | A1 | * | 2/2005 | Dang et al. .................. 524/115 |

OTHER PUBLICATIONS

Bucio, E., et al., "Synthesis and Characterization of New Polyesters Derived from Diphenols and Aromatic Diacids Chlorides". Polymer Bulletin, 56, pp. 163-170, (2006).*
Wiacek, Kevin, "Synthesis and Electrical Properties of Fluorenyl Polyesters incorporating Diamond Fragments". Thesis, Wright State University, pp. 1-125, 2007.*
S.J. Rzad et al., "Advanced Materials for High Energy Density Capacitors", IEEE 35th International Power Sources Symposium, Jun. 22-25, 1992, pp. 358-362.
M. Rabuffi et al, "Status Quo and Future Prospects for Metallized Polypropylene Energy Storage Capacitors", IEEE Transactions on Plasma Science, 2002, pp. 1939-1942, vol. 30(5).
J.E. Dahl et al, "Isolation and Structure of Higher Diamondoids, Nanometer-Sized Diamond Molecules", Science, Jan. 3, 2003, pp. 96-99, vol. 299.
W. Ebert et al, "High-Temperature Diamond Capacitor", Diamond and Related Materials, 1999, pp. 1875-1877, vol. 8, Elsevier.
G.C. McIntosh et al., "Diamond Fragments as Building Blocks of Functional Nanostructures", Physical Review B, 2004, pp. 045401-1 to 045401-8, vol. 70.

* cited by examiner

*Primary Examiner*—Bret Chen
(74) *Attorney, Agent, or Firm*—AFMCLO/JAZ; Dan Krieger

(57) ABSTRACT

The present invention provides a method for making a polymer dielectric composition incorporating diamondoids or diamond-like hydrocarbon units. The method includes forming a polymer solution from the cardo-diol 9,9-bis(4-hydroxyphenyl)fluorene and a diacid chloride, casting a freestanding thin polyester film from the polymer solution, and metallizing the polyester film with an evaporated Al layer to form the dielectric composition. The diacid chloride may be derived from trans-1,4-cyclohexanedicarboxylic acid; 1,3-adamantanedicarboxylic acid; or 4,9-diamantanedicarboxylic acid.

20 Claims, 4 Drawing Sheets

METHOD FOR MAKING HIGH TEMPERATURE POLYMER DIELECTRIC COMPOSITIONS INCORPORATING DIAMOND-LIKE HYDROCARBON UNITS FOR CAPACTIVE ENERGY STORAGE APPLICATIONS

CROSS-REFERENCE TO RELATED APPLICATIONS

This application is related to, and claims priority from, co-pending U.S. Provisional Patent Application No. 60/783, 105, filed on Mar. 10, 2006, by inventor Thuy D. DANG et. al., and entitled "High Temperature Polymer Dielectric Compositions Incorporating Diamond-Like Hydrocarbon Units for Capacitive Energy Storage Applications."

RIGHTS OF THE GOVERNMENT

The invention described herein may be manufactured and used by or for the Government of the United States for all governmental purposes without the payment of any royalty.

FIELD OF THE INVENTION

The present invention relates to polymer dielectric compositions, and more particularly, to high temperature polyesters incorporating diamondoid units for use in high-density capacitive energy storage.

BACKGROUND OF THE INVENTION

The inadequacy of commercial-off-the-shelf capacitors in meeting the challenges of high voltage, pulse-power driven applications makes it imperative to design next generation dielectric materials for the development of high energy density storage devices. These are suitable for a variety of energy delivery systems such as high power microwave sources, lasers, particle beam accelerators, space power conditioning in satellites and spacecraft as well as oil drilling and mining operations. Such energy sources should also be compact, especially for mobile applications, underscoring the significance of weight savings for high-energy capacitive storage.

The volumetric energy density of an electrostatic capacitor is expressed in the following equation:

$$D_v = \in \in_0 E^2 / 2 \text{ J/cc}$$

where $\in$ is the relative dielectric constant of the medium, $\in_0$ is the permittivity of free space ($8.85 \times 10^{-14}$ F/cm) and E is the applied field in V/cm.

The gravimetric energy density, expressed as J/g, is obtained as follows:

$$D_g = \in \in_0 E^2 / 2\rho$$

where $\rho$ is the material density. Enhanced energy density would require increased dielectric constant or the maximum voltage applied prior to breakdown or both, while keeping the density to a minimum. Since energy density varies as the square of the applied electric field, there is a greater payoff in attaining higher breakdown voltage (BDV) for the dielectric study.

Polymer dielectrics are the preferred materials of choice for such high voltage, pulse power capacitor applications because of their potential for high breakdown strengths, low dissipation factors and good dielectric stability despite having inherently lower dielectric constants relative to ceramic capacitors. Among the metallized thin film capacitors known commercially, the biaxially oriented polypropylene (BOPP) is known to exhibit the highest breakdown strength (~650 V/$\mu$, 16 kV/mil.) and a desirably low dielectric loss factor or dissipation factor ($10^{-4}$ at 1 kHz) but its drawbacks are a very low dielectric constant (2.2) and a low service temperature (~105° C.).

The commercial polyester dielectric PET, also used in capacitors, has a dielectric constant of 3.3 and a reasonably high breakdown strength (570 V/$\mu$, 14 kV/mil.), but has a relatively high dissipation factor (~$10^{-2}$ at 1 kHz), which increases with temperature and frequency. PET is also limited by a maximum operating temperature of 125° C.

Thus, there is a current, pressing need for ultra-high energy density polymer dielectrics with a high dielectric strength, ideally, >650 V/$\mu$ or 16 kV/mil., with an acceptably low dielectric loss, dielectric constants in the 3.0-5.0 range and with preferred service temperatures exceeding 200° C. This means that they should have high glass transition temperatures (preferably 250° C. and above) and thermal and thermooxidative stabilities >400° C. High glass transition temperatures in polymer dielectric films can help delay the initiation of electromechanical breakdown under an applied electric field since the electrical breakdown characteristics of polymers in the temperature region near their softening points are similar to the changes in the film mechanical properties.

A rational choice for the design and evaluation of a polymer dielectric has to take into account the figures of merit provided by already existing materials paradigms; one such model is the polycrystalline CVD (chemical vapor-deposited) diamond film, known to be an exemplary high temperature capacitor. It has a relatively high dielectric constant (5.68), has the potential to store energy density of ~10 J/cc at a breakdown strength of 16 kV/mil., and an exceptionally low dissipation factor (<$10^{-5}$ at 1 kHz). Major drawbacks of the CVD diamond are costs, difficulty of large area synthesis and undesirable roughness of the growth surface.

Based on the favorable analogy of diamond, high temperature polymer dielectrics incorporating diamond-like hydrocarbon subunits (or diamondoids) in the polymer backbone were developed and evaluated as capacitor dielectrics for high voltage applications. The diamondoids are essentially hydrogen-terminated diamond fragments. This rationale is validated by the fact that large HOMO (Highest Occupied Molecular Orbital)-LUMO (Lowest Unoccupied Molecular Orbital) gaps in diamondoids are considered as molecular counterparts of a large fundamental band gap in diamond, which is responsible for its optical transparency in the visible region as well as its electrically insulating properties.

SUMMARY OF THE INVENTION

The present invention describes some new, high temperature polyester compositions incorporating diamondoid units in their backbone and the results of the dielectric testing of metallized thin films fabricated from those compositions. The structure-property correlations relating the dielectric performance of the polyester to the presence of the chemically bonded diamondoid unit in the polymer backbone are also described in this invention.

Specifically, the polyester compositions essentially include a cycloaliphatic or a cage-like hydrocarbon unit which can be considered as diamond-like subunits. These hydrocarbon units increase in complexity of the diamond-like subunit in the series, trans-1,4-cyclohexane, 1,3-adamantane and 4,9-diamantane structural units. All the polyester compositions described in this invention contain a structural linking unit based on 9,9-bis(4-hydroxyphenyl)fluorene (BHPF). BHPF is a monomeric cardo-unit known for conferring desirable thermal properties in polymers such as high glass transition temperatures and good thermal and thermooxidative stabilities besides favoring polymer solubility and processability in readily available organic solvents.

In accordance with one aspect of the invention, there is provided a method for making a polymer dielectric composition. The method includes forming a polymer solution from 9,9-bis-(4-hydroxyphenyl)fluorene and a diacid chloride, casting a freestanding thin polyester film from the polymer solution, and metallizing both sides of the polyester film with evaporated Aluminum (Al) layers to form the dielectric composition.

The acid chloride may be derived from trans-1,4-cyclohexanedicarboxylic acid, whereby the polyester film is FCHPE (Fluorenyl Cyclohexyl Polyester). The dielectric composition having FCHPE may have an average breakdown voltage of 3.6 MV/cm, a dielectric constant of 3.3, and an energy density of 1.90 J/cc. Alternatively, the acid chloride may be derived from 1,3-adamantanedicarboxylic acid, whereby the polyester film is FADPE (Fluorenyl Adamantyl Polyester). The dielectric composition having FADPE may have an average breakdown voltage of 3.5 MV/cm, a dielectric constant of 2.5, and an energy density of 1.35 J/cc. Furthermore, the acid chloride may be derived from 4,9-diamantanedicarboxylic acid, whereby the polyester film is FDAPE (Fluorenyl Diamantyl Polyester). The dielectric composition having FDAPE may have an average breakdown voltage of 5.43-5.65 MV/cm, a dielectric constant of 2.9, and an energy density of 3.8-4.1 J/cc.

In a related aspect of the invention, the freestanding thin polyester film of the present invention may have a thickness of approximately 5-7 μm. The evaporated Al layer metallized on the polyester film may be approximately 50 nm thick.

In accordance with another aspect of the invention, there is provided a method for making a polymer dielectric composition. The method includes forming a polymer solution from BHPF, a diacid chloride, and adamantane-1-carboxylic acid chloride as the end-capping agent; casting a freestanding thin polyester film from the polymer solution; and metallizing the polyester film with an evaporated Al layer to form the dielectric composition.

The acid chloride may be derived from trans-1,4-cyclohexanedicarboxylic acid, whereby the polyester film is FCHPE-EC (Fluorenyl Cyclohexyl Polyester End-capped). Alternatively, the acid chloride may be derived from 1,3-adamantanedicarboxylic acid, whereby the polyester film is FADPE-EC (Fluorenyl Adamantyl Polyester End-capped). Furthermore, the acid chloride may be derived from 4,9-diamantanedicarboxylic acid, whereby the polyester film is FDAPE-EC (Fluorenyl Diamantyl Polyester End-capped).

BRIEF DESCRIPTION OF THE DRAWINGS

Preferred features of the present invention are disclosed in the accompanying drawings, wherein similar reference characters denote similar elements throughout the several views, and wherein.

DETAILED DESCRIPTION OF THE INVENTION

Figure 1:
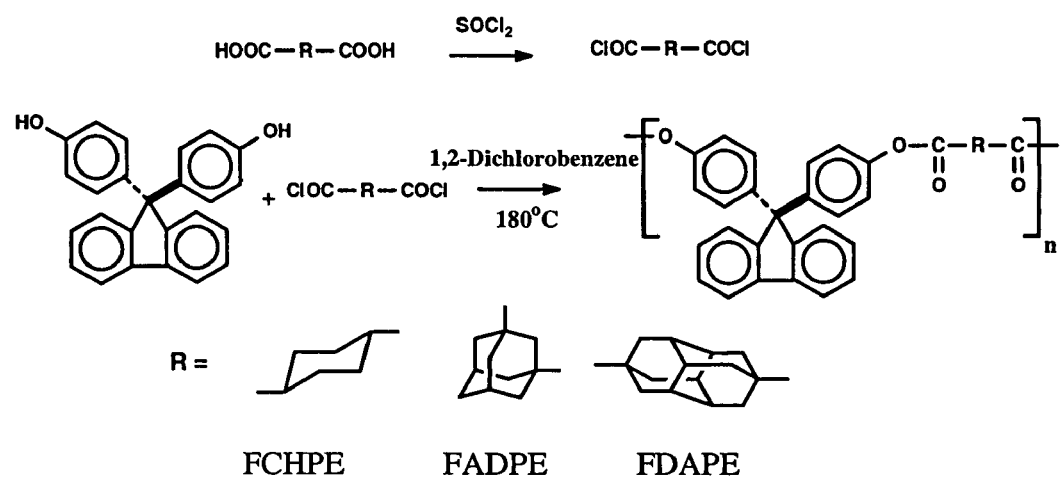
FIG. 1 is a diagram showing the synthesis of cardo-type polyesters incorporating cycloaliphatic or diamondoid structural units in the polymer backbone.

The polyesters of the present invention are formed from the solution polymerization reaction between the cardo-monomer 9,9-bis(4-hydroxyphenyl)fluorene (BHPF) and the acid chlorides derived from trans-1,4-cyclohexanedicarboxylic acid; 1,3-adamantanedicarboxylic acid; and 4,9-diamantanedicarboxylic acid. The synthesis of all these polyesters (designated as FCHPE, FADPE and FDAPE respectively) is depicted in FIG. 1. The solution properties of the polyesters are described in Table 1.

Figure 2:
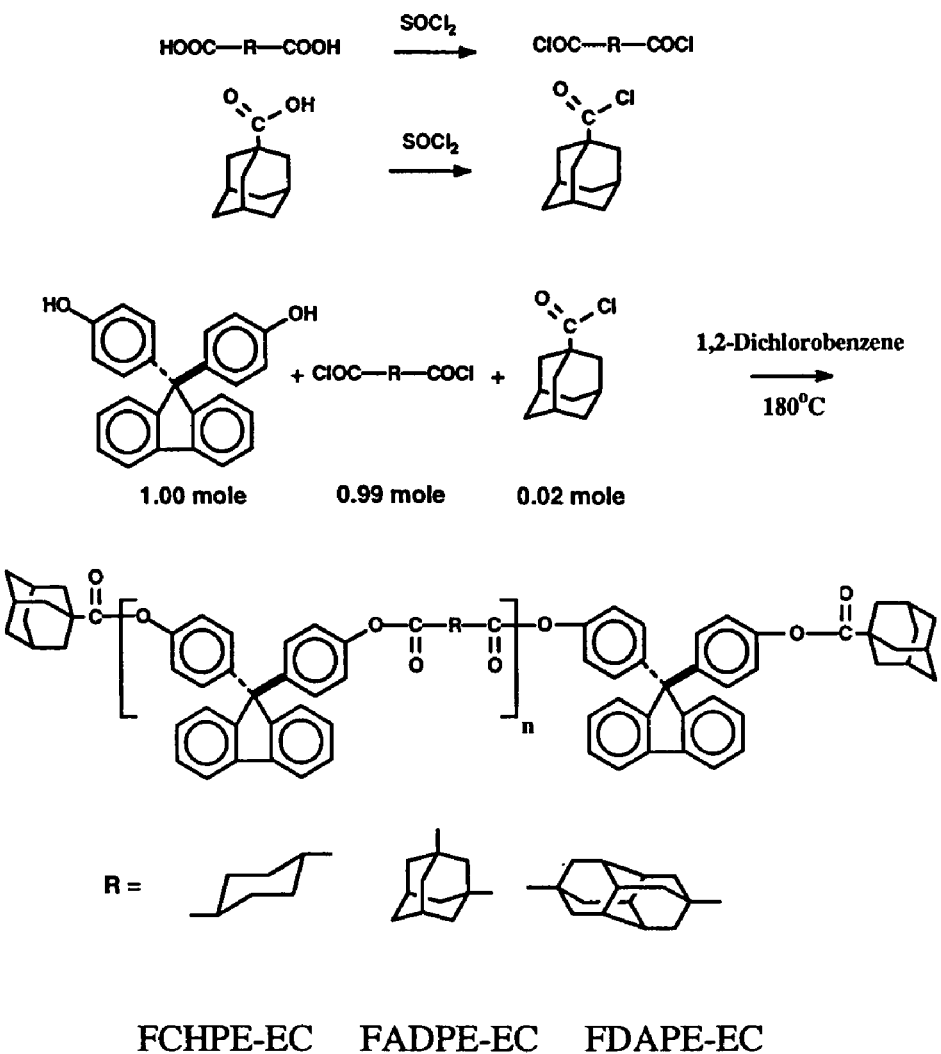
FIG. 2 is a diagram showing the synthesis of cardo-type polyesters incorporating cycloaliphatic or diamondoid units and with 1-adamantoyl endcap.

While the scheme of FIG. 1 describes the synthesis of the polyesters with no endcaps, a series of polyesters with an adamantoyl endcap was also synthesized. The endcapping agent used is adamantane-1-carboxylic acid chloride, also referred to as adamantane-1-carbonyl chloride. The synthesis of these polymeric compositions is depicted in FIG. 2. The homopolyesters were soluble in a variety of solvents such as NMP (N-methylpyrrolidone), DMAc (N,N-dimethylacetamide) and $CHCl_3$ (chloroform).

TABLE 1

Solution Properties of the Cardo-type Polyesters

| Polymer | Solubility | I. V. (dl/g)* | Film Properties |
|---|---|---|---|
| FCHPE | $CHCl_3$, chlorobenzene, NMP, DMAc | 0.46 | Clear, flexible, tough |
| FADPE | $CHCl_3$, chlorobenzene, NMP, DMAc | 0.51 | Clear, flexible, tough |
| FDAPE | $CHCl_3$, chlorobenzene, NMP, DMAc | 0.98 | Clear, flexible, tough |
| FDAPE (II)** | | 0.51 | |

*Intrinsic viscosity in NMP at 30° C.
**Refers to another batch of the same polymer composition The intrinsic viscosities ranged from 0.46 dl/g to 0.98 dl/g, indicating moderately high to high molecular weights. This was also indicated by the mechanical integrity of the tough, flexible freestanding polymer films which were cast from chloroform.

Figure 3:
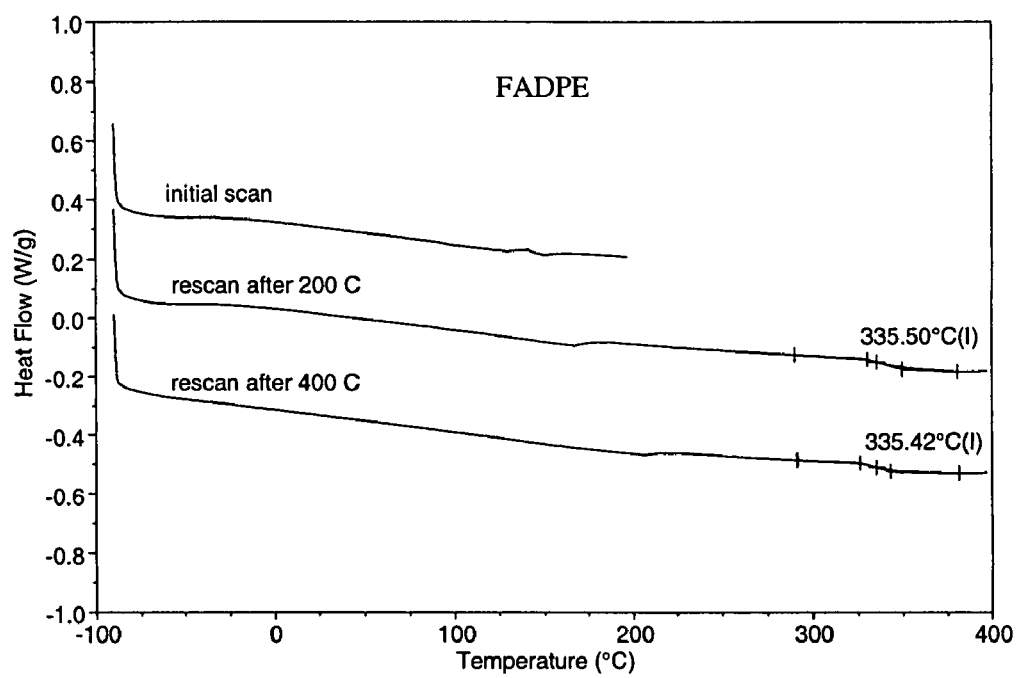
FIG. 3 is differential scanning calorimetry (DSC) showing the high glass transition temperature of FADPE.
Figure 4:
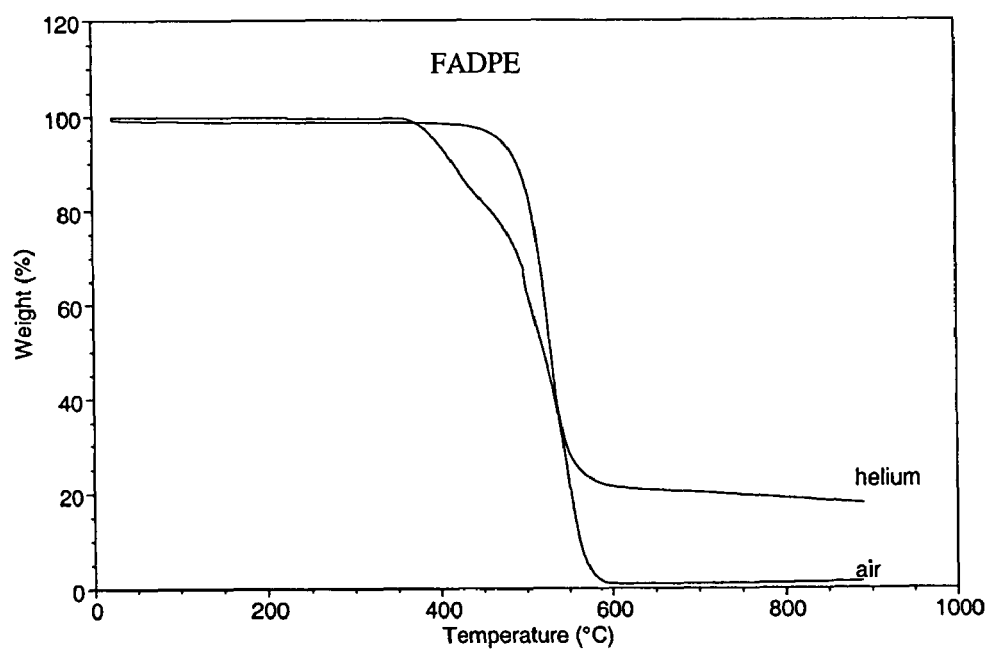
FIG. 4 is thermo-gravimetric analysis (TGA) showing the thermal and thermo-oxidative stabilities of FADPE.

The high glass transition temperatures ranging from 331° C. to >400° C. as well as the thermal degradation temperatures (in helium) in the 405-460° C. range (Table 2) makes these polymers eminently suitable for high temperature capacitor film applications with operating temperatures exceeding 200° C. The polymers containing 1,3-adamantane and the 4,9-diamantane units were nearly of the same thermal and thermooxidative stability while that of the polymer incorporating trans-1,4-cyclohexyl moiety was slightly lower. As an example, the DSC traces in FIG. 3 and the TGA traces in FIG. 4 are illustrative of the thermal behavior of the polyester incorporating 1,3-adamantane unit (FADPE).

TABLE 2

Thermal Properties Of Cardo-type Polyesters

| | Thermal Properties (° C.) | | |
|---|---|---|---|
| Polymer | $T_g$* | $T_d$(He)** | $T_d$(air)** |
| FCHPE | 331 | 405 | 360 |
| FADPE | 336 | 460 | 400 |

TABLE 2-continued

Thermal Properties Of Cardo-type Polyesters

| Polymer | Thermal Properties (° C.) | | |
|---|---|---|---|
| | $T_g$* | $T_d$ (He)** | $T_d$ (air)** |
| FDAPE | >400 | 460 | 380 |

*DSC rescan ($N_2$) after initial heating to 200° C.
**Temperature at which 5% weight loss occurred For comparison, the solution and thermal properties of the polyesters with the attached adamantoyl endgroup are also shown in Table 3. In general, the properties of the endcapped polyesters are quite similar to those of the polyesters without the endcaps.

TABLE 3

Solution And Thermal Properties Of Cardo-polyesters With 1-adamantoyl endcap

| Polymer | Intrinsic Viscosity (dl/g, NMP, 30° C.) | Cast film from CHCl₃ | $T_g$ (° C.)* | $T_d$ (° C., 5 wt % loss) | |
|---|---|---|---|---|---|
| | | | | He | Air |
| FCHPE-EC | 0.76 | Clear, flexible, tough | 319 | 400 | 370 |
| FADPE-EC | 0.45 | Clear, flexible, tough | 335 | 490 | 400 |
| FDAPE-EC | 0.40 | Clear, flexible, tough | >400 | 445 | 400 |

*DSC rescan in nitrogen atmosphere after initial heating to 200° C..

The polymers of the present invention were cast into free-standing thin films (5-7 μm range, measured by profilometry) from dilute polymer solutions in chloroform. The solutions were filtered through a 0.45μ PTFE membrane syringe filter, and the solvent was slowly evaporated from a tall cylindrical casting dish with a flat bottom, placed in a desiccator. After complete solvent evaporation, the film was carefully floated off the glass surface after the addition of de-ionized, distilled water to the casting dish. The film was finally vacuum-dried at 80° C. over 48 hours. The films were metallized with an evaporated Al layer, 50 nm thick, on either side. The breakdown strength measurements were performed using a precision regulated high voltage power supply model Bertran 210-05 R or Spellman SR6.

The dissipation factor, also known as the dielectric loss factor ($\in''/\in'$ where $\in''$ and $\in'$ are the imaginary and the real parts of the dielectric constant) of the metallized dielectric films, was measured with a 4284 A precision LCR meter from Agilent Technologies in the frequency range of 20 Hz-1 MHz. The measurement of bulk dielectric constants was accomplished on much thicker chloroform-cast films (~80 μm, unmetallized) using an EG & G Model 283 Potentiostat over a frequency range of 1 Hz-1 MHz with an amplitude of 5 mV rms. The film dielectric constant is determined as $\in=Cd/\in_0 A$, where C is the capacitance of the sample holder with the sample, d is the sample thickness, A is the sample area and $\in_0$ is the permittivity of free space. The room temperature measurement of film dielectric properties, mainly, the average breakdown voltage, the dissipation factor and the dielectric constant are described in Table 4 and the trend is illustrated for the representative polyester films.

TABLE 4

Dielectric Properties of Cardo-type Polyester Films

| Polymer Thin Film | Average Breakdown Voltage (MV/cm) | Dissipation Factor @ 1 kHz | Dielectric Constant $\epsilon$ | Energy Density $D_v$ (calculated, J/cc) |
|---|---|---|---|---|
| FCHPE | 3.6 | $3.3 \times 10^{-3}$ | 3.3 | 1.90 |
| FADPE | 3.5 | $3.6 \times 10^{-3}$ | 2.5 | 1.35 |
| FDAPE | 5.43 | $7.0 \times 10^{-3}$ | 2.9 | 3.8 |
| FDAPE II | 5.65 | $1.4 \times 10^{-3}$ | 2.9 | 4.1 |

The metallized thin film polyester dielectric with the 4,9-diamantyl unit (FDAPE) was found to have the highest breakdown strength (average BDV of 543 V/μ or 13.6 kV/mil., for one of the films and average BDV of 565 V/μ or 14.1 kV/mil., for the other). The highest calculated energy densities of 3.8 J/cc and 4.1 J/cc, obtained for the FDAPE films among all the dielectric films tested, are, at the least, comparable to the energy densities reported for commercial polymer dielectrics such as polypropylene and PET but with the added advantage of much higher use temperatures for capacitor applications than both polypropylene and PET as well as a lower dielectric loss at 1 kHz, compared to PET. Even with a slightly lower dielectric constant (2.9 vs 3.3 for FCHPE), the calculated energy density of FDAPE has been doubled relative to FCHPE with just a 50 percent increase in the average breakdown voltage.

The following examples illustrate the formation of various polyester dielectric compositions incorporating cycloaliphatic/diamondoid hydrocarbon structural units.

Example 1

FCHPE

Trans-1,4-cyclohexanedicarboxylic acid (7.5 g) was heated to reflux under nitrogen with 70 ml thionyl chloride in the presence of a few drops of N,N-dimethylformamide (DMF). After 3 hours, a clear solution was obtained. The excess thionyl chloride was removed and the crude residue was recrystallized from hot heptane to obtain 5.5 g of white crystals of the diacid chloride, m.pt., 65-66° C.

Next, synthesis of a cardo-polyester with trans-1,4-cyclohexyl group was performed. In a three-necked flask fitted with a magnetic stirrer-bar, a reflux condenser and a nitrogen inlet, 9,9-bis(4-hydroxyphenyl)fluorene (3.5041 g, 10 m.moles) and trans-1,4-cyclohexanedicarboxylic acid chloride (2.091 g, 10 m. moles) were mixed with anhydrous 1,2-dichlorobenzene (17 ml). The mixture was heated initially to a temperature of 100° C. for complete dissolution of the monomers and the temperature was raised to 165° C. After 16 hours, the temperature of the polymerization was increased to 180° C. and the reaction was continued for another 4 hours. After cooling, the viscous solution was added to a large excess of methanol to precipitate the polymer. After soxhlet extraction with methanol and vacuum drying, the polymer was purified via dissolution in chloroform and reprecipitation in excess heptane. The filtered white polymer was dried in vacuo at 100° C. for 24 hours. The yield of the recovered polymer after purification was 4.4 g (91 percent). The intrinsic viscosity of the polymer was measured in NMP at 30° C. at an initial concentration of 0.25 g/dl.

Example 2

FADPE 1,3-Adamantanedicarboxylic acid (6.5 g) was mixed with 75 ml thionyl chloride and a few drops of DMF and the mixture was heated to reflux under nitrogen. The homogeneous solution was cooled and after removal of excess thionyl chloride, the crude diacid chloride was mixed with 200 ml heptane and heated to reflux under nitrogen. The solution was hot filtered and the filtrate was concentrated to yield white crystals of the acid chloride (5.7 g), m.pt., 91-92° C.

Next, synthesis of a cardo-polyester incorporating 1,3-adamantyl group was performed. In a three-necked flask fitted with a magnetic stirrer-bar, a reflux condenser and a nitrogen inlet, 9,9-bis(4-hydroxyphenyl)fluorene (2.000 g, 5.7 m.moles) and 1,3-adamantanediacid chloride (1.491 g, 5.7 m. moles) were mixed with anhydrous 1,2-dichlorobenzene (15 ml) under a flow of nitrogen. The mixture was heated initially to a temperature of 100° C. for complete dissolution of the monomers and the temperature was raised to 165° C. After 16 hours, the temperature of the polymerization was raised to 180° C. and the reaction was continued for another 4 hours. After cooling, the viscous solution was added to a large excess of methanol to precipitate the polymer. After soxhlet extraction with methanol and vacuum drying, the polymer was purified via dissolution in chloroform and reprecipitation in excess heptane. The filtered white polymer was dried in vacuo at 100° C. for 24 hours. The yield of the polymer was 2.9 g (94 percent). The intrinsic viscosity of the polymer was measured in NMP at 30° C. at an initial concentration of 0.25 g/dl.

Example 3

FDAPE 4,9-Diamantanedicarboxylic acid (3 gms) was refluxed for 3 hours with an excess (60 ml) of thionyl chloride in presence of a few drops of DMF under a flow of dry nitrogen. The hot, yellow solution was filtered hot and the thionyl chloride was removed in a rotary evaporator. The off-white residue was recrystallized from 300 ml hot heptane. A yield of 2 g was obtained, m.pt., 230-232° C.

Next, synthesis of a cardo-polyester incorporating 4,9-diamantyl group was performed. In a three-necked flask fitted with a magnetic stirrer-bar, a reflux condenser and a nitrogen inlet, 9,9-bis(4-hydroxyphenyl)fluorene (2.237 g, 6.4 m.moles) and 4,9-diamantanediacid chloride (2.000 g, 6.4 m. moles) were mixed with anhydrous 1,2-dichlorobenzene (17 ml) so as to provide 15 wt % final polymer composition. The mixture was heated to a temperature of 165° C. after complete dissolution of the monomers. After 16 hours, the temperature was raised to 180° C. and the polymerization was continued for another 4 hours. After cooling, the viscous solution was added to a large excess of methanol to precipitate the polymer. After soxhlet extraction with methanol and vacuum drying, the polymer was purified via dissolution in chloroform and reprecipitation in excess heptane. The filtered off-white polymer was dried in vacuo at 100° C. for 24 hours. The yield of the polymer was 3.6 g (95 percent). The intrinsic viscosity of the polymer was measured in NMP at 30° C. at an initial concentration of 0.25 g/dl.

Example 4

FDAPE II

Additionally, synthesis of a cardo-polyester incorporating 4,9-diamantyl group was performed. In a three-necked flask fitted with a magnetic stirrer-bar, a reflux condenser and a nitrogen inlet, 9,9-bis(4-hydroxyphenyl)fluorene (recrystallized from toluene, 1.0 g, 2.86 m.moles) and 4,9-diamantanediacid chloride (0.894 g, 2.86 m. moles) were mixed with anhydrous 1,2-dichlorobenzene (8 ml) under a dry nitrogen flow. The mixture was heated to a temperature range of 165° C.-170° C. after complete dissolution of the monomers. After 24 hours, the polymerization mixture was cooled to room temperature. The viscous solution was added to a large excess of methanol to precipitate the polymer. After soxhlet extraction with methanol and vacuum drying, the polymer was purified via dissolution in chloroform and reprecipitation in excess heptane. The filtered off-white polymer was dried in vacuo at 100° C. for 24 hours. The yield of the polymer was 1.6 g (94%). The intrinsic viscosity of the polymer was measured in NMP at 30° C. at an initial concentration of 0.25 g/dl.

Example 5

FCHPE-EC

First, synthesis of adamantane-1-carbonyl chloride was performed. Adamantane-1-carboxylic acid (3 gms) was heated with an excess of thionyl chloride (15 ml). A homogeneous solution was obtained after 3 hours of reflux. The thionyl chloride was removed in vacuo and a low melting (51-53° C.) crystalline white solid was obtained in essentially quantitative yields. The acid chloride was maintained under a purge of dry nitrogen for use as the endcapping agent for the polyesters.

Next, synthesis of a cardo-polyester with trans-1,4-cyclohexyl group and 1-adamantoyl endcap was performed. In a three-necked flask fitted with a magnetic stirrer-bar, a reflux condenser and a nitrogen inlet, 9,9-bis(4-hydroxyphenyl) fluorene (3.5041 g, 10 m.moles) and trans-1,4-cyclohexanedicarboxylic acid chloride (2.069 g, 99 mole % relative to the cardo-diol) were mixed with 17 ml anhydrous 1,2-dichlorobenzene as the solvent to provide an initial solids concentration of 20 wt %. The mixture was heated initially to a temperature of 100° C. for complete dissolution of the monomers and the temperature was raised to 165° C. and the solution was maintained at that temperature overnight. The temperature was raised to 175° C. and maintained for two hours before the addition of the endcapping agent, adamantane-1-carbonyl chloride (0.039 g, $2 \times 10^{-4}$ mole, 2 mole % relative to the cardo-diol), dissolved in 5 ml 1,2-dichlorobenzene. The temperature of the bath was then raised to 185° C. and the reaction was continued for a further 6 hours. After cooling, the highly viscous solution was diluted with a further 10 ml addition of 1,2-dichlorobenzene and added to a large excess of methanol (750 ml) to precipitate the polymer. Clumps of tough, fibrous white polymer were broken up in a blender prior to filtration followed by soxhlet extraction with methanol for 48 hours. After vacuum drying at 100° C., the polymer was purified via dissolution in chloroform and reprecipitation in excess heptane. After filtration and vacuum drying at 100° C., 4.5 g of a very fluffy, white solid was obtained (93%). The filtered white polymer was dried in vacuo at 100° C. for 24 hours. The yield of the recovered polymer after purification was 4.5 g (93 percent). The intrinsic viscosity of the polymer was measured in NMP at 30° C. at an initial concentration of 0.25 g/dl.

Example 6

FADPE-EC

Synthesis of a cardo-polyester with 1,3-adamantyl group and 1-adamantoyl endcap was performed as follows. In a three-necked flask fitted with a magnetic stirrer-bar, a reflux condenser and a nitrogen inlet, 9,9-bis(4-hydroxyphenyl)fluorene (2.014 g, 5.7 m.moles) and 1,3-adamantanedicarboxylic acid chloride (1.486 g, 99 mole % relative to the cardo-diol) were mixed with 12 ml anhydrous 1,2-dichlorobenzene as the solvent to provide a final polymer concentration of ~16 wt %. The mixture was heated under a nitrogen atmosphere to a temperature of 100° C. for complete dissolution of the monomers, and the temperature was raised to 165° C. and the solution was maintained at that temperature overnight. The temperature was raised to 175° C., and after 2 hours, the endcapping agent, adamantane-1-carbonyl chloride (0.023 g, $1.15 \times 10^{-4}$ mole, 2 mole % relative to the cardo-diol) was added as a 5 ml solution in 1,2-dichlorobenzene. The temperature of the bath was then raised to 185° C. and the reaction was continued for a further 6 hours. After cooling, the viscous solution was slowly added to 500 ml methanol to precipitate the polymer. After filtration and soxhlet extraction with methanol for 48 hours, the polymer was dried in vacuo at 100° C. The solid was redissolved in chloroform (~5 wt % solution) and the filtered solution was slowly added to a large volume of heptane to precipitate a white, fibrous solid. After filtration and vacuum drying, 2.7 g of the polymer (isolated yield 90%) was obtained. The intrinsic viscosity of the polymer was measured in NMP at 30° C. at an initial concentration of 0.25 g/dl.

Example 7

FDAPE-EC

Synthesis of a cardo-polyester with 4,9-diamantyl group and 1-adamantoyl endcap was performed as follows. In a three-necked flask fitted with a magnetic stirrer-bar, a reflux condenser and a nitrogen inlet, 9,9-bis(4-hydroxyphenyl)fluorene (2.26 g, 6.4 m.moles) and 4,9-diamantanedicarboxylic acid chloride (1.99 g, 99 mole % relative to the cardo-diol) were mixed with 17 ml anhydrous 1,2-dichlorobenzene as the solvent to provide a final polymer concentration of ~15 wt %. The mixture was heated under a nitrogen atmosphere to a temperature of 100° C. for complete dissolution of the monomers, and the temperature was raised to 165° C. and the solution was maintained at that temperature overnight. To the hot solution was added the endcapping agent, adamantane-1-carbonyl chloride (0.026 g, $1.3 \times 10^{-4}$ mole, 2 mole % relative to the cardo-diol) as a 5 ml solution in 1,2-dichlorobenzene. The temperature of the bath was then raised to 185° C. and the reaction was continued for a further 6 hours. After cooling, the viscous solution was slowly added to 500 ml methanol to precipitate the polymer. After filtration and soxhlet extraction with methanol for 48 hours, the polymer was dried in vacuo at 100° C. The solid was redissolved in chloroform (~5 wt % solution) and the filtered solution was slowly added to a large volume of heptane to reprecipitate a white solid. After filtration and vacuum drying at 100° C., 3.5 g of the polymer (isolated yield 92%) was obtained. The intrinsic viscosity of the polymer was measured in NMP at 30° C. at an initial concentration of 0.25 g/dl.

What is claimed is:

1. A method for making a polymer dielectric composition, the method comprising:
    forming a polymer solution from 9,9-bis(4-hydroxyphenyl)fluorene and a diacid chloride;
    casting a freestanding thin polyester film from the polymer solution; and
    metallizing the polyester film with an evaporated Al layer to form the dielectric composition.

2. The method of claim 1 wherein the diacid chloride is derived from trans-1,4-cyclohexanedicarboxylic acid.

3. The method of claim 2 wherein the polyester film is FCHPE.

4. The method of claim 3 wherein the polyester film has a thickness of approximately 5-7 μm.

5. The method of claim 4 wherein the Al layer is approximately 50 nm thick.

6. The method of claim 5 wherein the dielectric composition has an average breakdown voltage of about 3.6 MV/cm.

7. The method of claim 1 wherein the diacid chloride is derived from 1,3-adamantanedicarboxylic acid.

8. The method of claim 7 wherein the polyester film is FADPE.

9. The method of claim 8 wherein the polyester film has a thickness of approximately 5-7 μm.

10. The method of claim 9 wherein the Al layer is approximately 50 nm thick.

11. The method of claim 10 wherein the dielectric composition has an average breakdown voltage of about 3.5 MV/cm.

12. The method of claim 1 wherein the diacid chloride is derived from 4,9-diamantanedicarboxylic acid.

13. The method of claim 12 wherein the polyester film is FDAPE.

14. The method of claim 13 wherein the polyester film has a thickness of approximately 5-7 μm.

15. The method of claim 14 wherein the Al layer is approximately 50 nm thick.

16. The method of claim 13 wherein the dielectric composition has an average breakdown voltage-of about 5.43-5.65 MV/cm.

17. A method for making a polymer dielectric composition, the method comprising:
    forming a polymer solution from BHPF, a diacid chloride, and adamantane-1-carboxylic acid chloride;
    casting a freestanding thin polyester film from the polymer solution; and
    metallizing the polyester film with an evaporated Al layer to form the dielectric composition.

18. The method of claim 17 wherein the diacid chloride is derived from trans-1,4-cyclohexanedicarboxylic acid and wherein the polyester film is FCHPE-EC.

19. The method of claim 17 wherein the diacid chloride is derived from 1,3-adamantanedicarboxylic acid and wherein the polyester film is FADPE-EC.

20. The method of claim 17 wherein the diacid chloride is derived from 4,9-diamantanedicarboxylic acid and wherein the polyester film is FDAPE-EC.

* * * * *